United States Patent
Ito et al.

(10) Patent No.: US 11,624,783 B2
(45) Date of Patent: Apr. 11, 2023

(54) BATTERY DIAGNOSIS APPARATUS AND VEHICLE

(71) Applicant: TOYOTA JIDOSHA KABUSHIKI KAISHA, Toyota (JP)

(72) Inventors: Hirotaka Ito, Nagoya (JP); Hiroshi Yoshida, Anjou (JP); Yoshihiro Uchida, Nagakute (JP); Tetsuya Watanabe, Chita-gun (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 192 days.

(21) Appl. No.: 17/162,278

(22) Filed: Jan. 29, 2021

(65) Prior Publication Data
US 2021/0247450 A1  Aug. 12, 2021

(30) Foreign Application Priority Data
Feb. 12, 2020  (JP) .............................. JP2020-021716

(51) Int. Cl.
| | | |
|---|---|---|
| G01R 31/36 | (2020.01) | |
| G01R 31/382 | (2019.01) | |
| H01M 10/44 | (2006.01) | |
| H01M 10/48 | (2006.01) | |
| B60L 58/12 | (2019.01) | |

(52) U.S. Cl.
CPC .......... *G01R 31/3648* (2013.01); *B60L 58/12* (2019.02); *G01R 31/382* (2019.01); *H01M 10/44* (2013.01); *H01M 10/48* (2013.01)

(58) Field of Classification Search
None
See application file for complete search history.

(56) References Cited

U.S. PATENT DOCUMENTS

| | | |
|---|---|---|
| 2012/0081075 A1 | 4/2012 | Skelton |
| 2015/0355286 A1 | 12/2015 | Kobayashi et al. |
| 2016/0149421 A1* | 5/2016 | White ............... H02J 7/0014 320/121 |
| 2017/0222291 A1* | 8/2017 | Elliott ............... H01M 16/006 |
| 2019/0198945 A1 | 6/2019 | Machida et al. |

FOREIGN PATENT DOCUMENTS

| | | |
|---|---|---|
| JP | 2006-337155 A | 12/2006 |
| JP | 2009-216448 A | 9/2009 |
| JP | 2015-187938 A | 10/2015 |
| JP | 2019-113455 A | 7/2019 |
| WO | 2014/115513 A1 | 7/2014 |

* cited by examiner

*Primary Examiner* — Roy Y Yi
(74) *Attorney, Agent, or Firm* — Oliff PLC

(57) ABSTRACT

A battery diagnosis apparatus includes an SOC calculator, a ΔSOC obtaining unit, a largest block identification unit, and a diagnosis unit. The SOC calculator calculates an SOC for each parallel cell block included in a battery assembly based on an output from a battery sensor that detects a state of the battery assembly. When charging or discharging of the battery assembly is carried out, the ΔSOC obtaining unit obtains ΔSOC for each parallel cell block. The largest block identification unit identifies a largest block in a diagnosis target. When a degree of deviation between ΔSOC of the largest block and a ΔSOC reference value exceeds a prescribed level, the diagnosis unit determines that abnormality has occurred in the largest block in the diagnosis target.

12 Claims, 12 Drawing Sheets

《PARALLEL CELL BLOCK》

FIG.10

| THRESHOLD VALUE Z | | FIRST SOC (BEFORE CHARGING)[%] | | |
|---|---|---|---|---|
| | | 20 | 40 | 60 |
| SECOND SOC (AFTER CHARGING) [%] | 40 | 2.0 | | |
| | 60 | 1.6 | 2.0 | |
| | 80 | 1.4 | 1.6 | 1.8 |

FIG.11

| THRESHOLD VALUE Z | | FIRST OFF PERIOD (BEFORE CHARGING) | | |
|---|---|---|---|---|
| | | SHORT | INTERMEDIATE | LONG |
| SECOND OFF PERIOD (AFTER CHARGING) | SHORT | 2.0 | 1.8 | 1.7 |
| | INTERMEDIATE | 1.8 | 1.7 | 1.6 |
| | LONG | 1.7 | 1.6 | 1.5 |

CHARGING CONDITION:
CURRENT OF 8A, DURATION OF 2h, AND AMOUNT OF CHARGING OF 16 Ah

| | NORMAL | | | ABNORMAL | | | ΔSOC | | ΔOCV | |
|---|---|---|---|---|---|---|---|---|---|---|
| | BATTERY CAPACITY | 1st_ΔSOC | 1st_ΔV | BATTERY CAPACITY | 1st_ΔSOC | 1st_ΔV | RATIO | DIFFERENCE | RATIO | DIFFERENCE |
| EXAMPLE 1 | 50.0Ah | 32.0% | 0.140V | 33.3Ah | 48.0% | 0.286V | 1.5 | 16.0% | 2.04 | 146mV |
| EXAMPLE 2 | 150Ah | 10.7% | 0.058V | 100Ah | 16.0% | 0.076V | 1.5 | 5.3% | 1.31 | 18mV |

FIG.12

BATTERY DIAGNOSIS APPARATUS AND VEHICLE

This nonprovisional application is based on Japanese Patent Application No. 2020-021716 filed with the Japan Patent Office on Feb. 12, 2020, the entire contents of which are hereby incorporated by reference.

BACKGROUND

Field

The present disclosure relates to a battery diagnosis apparatus and a vehicle.

Description of the Background Art

Japanese Patent Laying-Open No. 2009-216448 discloses a battery assembly including a plurality of parallel cell blocks. The parallel cell blocks each include a plurality of cells connected in parallel. The cell is a secondary battery that makes up the battery assembly. The plurality of parallel cell blocks included in the battery assembly are connected in series to each other. Japanese Patent Laying-Open No. 2009-216448 discloses a technique to sense break and disconnection of a parallel connector that connects cells by measuring a voltage across parallel cell blocks (that is, a voltage across an end of a parallel connector in a parallel cell block and an end of a parallel connector of a parallel cell block adjacent thereto).

SUMMARY

According to the technique disclosed in Japanese Patent Laying-Open No. 2009-216448, in which of two adjacent parallel cell blocks break has occurred is determined by making use of such a characteristic that variation in voltage in a cell used for discharging due to break of a parallel connector is larger than a threshold value y whereas variation in voltage in a cell no longer used for discharging due to break of the parallel connector is smaller than a threshold value p. Depending on a capacity, a state of power storage, or a status of charging and discharging of the battery assembly, however, fluctuation in voltage at the time of occurrence of break in a parallel cell block may be small. In such a case, it is difficult to highly accurately sense abnormality of the parallel cell block with the method described in Japanese Patent Laying-Open No. 2009-216448.

The present disclosure was made to solve the problem above, and an object thereof is to properly sense abnormality of a parallel cell block that makes up a battery assembly.

A battery diagnosis apparatus according to the present disclosure diagnoses a battery assembly including a plurality of parallel cell blocks, and includes an SOC calculator, a $\Delta$SOC obtaining unit, a largest block identification unit, and a diagnosis unit. In the battery assembly to be diagnosed, each of the plurality of parallel cell blocks includes a plurality of cells connected in parallel. In the battery assembly to be diagnosed, the plurality of parallel cell blocks are connected in series to each other.

The SOC calculator calculates an SOC for each of the parallel cell blocks included in the battery assembly based on an output from a battery sensor that detects a state of the battery assembly. When charging or discharging of the battery assembly is carried out, the $\Delta$SOC obtaining unit obtains $\Delta$SOC for each of the parallel cell blocks included in the battery assembly, the $\Delta$SOC representing magnitude of deviation between a first SOC and a second SOC, the first SOC representing the SOC at the time of start of charging or discharging, the second SOC representing the SOC after end of charging or discharging. The largest block identification unit identifies a largest block, the largest block being a parallel cell block largest in $\Delta$SOC in a diagnosis target set as a part or the entirety of the battery assembly. The diagnosis unit makes diagnosis of the diagnosis target based on a degree of deviation between the $\Delta$SOC of the largest block and a $\Delta$SOC reference value, and in diagnosis, when the degree of deviation exceeds a prescribed level, the diagnosis unit determines that abnormality has occurred in the largest block in the diagnosis target.

For example, due to break (including blowout of a fuse) or loosening of a fastener, electrical connection may be cut off in a part of a parallel cell block and a cell may break away from the parallel cell block. Such break-away of the cell leads to decrease in number of cells included in the parallel cell block and decrease in capacity of the parallel cell block and to increase in $\Delta$SOC (that is, an amount of variation in SOC of the parallel cell block due to charging or discharging of the battery assembly) of the parallel cell block. A state of charge (SOC) represents a remaining amount of stored power and is expressed as a ratio of a current amount of stored power to a capacity of a battery (that is, an amount of stored power in a fully charged state), for example, in a range from 0 to 100%.

In the battery diagnosis apparatus, the SOC calculator calculates the SOC for each of the parallel cell blocks based on an output from the battery sensor. Then, the $\Delta$SOC obtaining unit obtains $\Delta$SOC for each of the parallel cell blocks based on such an SOC. The largest block identification unit identifies a largest block (that is, a parallel cell block largest in $\Delta$SOC in a prescribed diagnosis target). When a cell breaks away as described above, $\Delta$SOC of the parallel cell block increases, and hence break-away of the cell in the largest block is highly likely. In the battery diagnosis apparatus, the diagnosis unit diagnoses the diagnosis target by comparing $\Delta$SOC of the largest block with a $\Delta$SOC reference value.

When a cell breaks away as described above, a degree of deviation between $\Delta$SOC of the largest block and the $\Delta$SOC reference value increases. The degree of deviation between $\Delta$SOC of the largest block and the $\Delta$SOC reference value is also referred to as a "$\Delta$SOC deviation degree." When the $\Delta$SOC deviation degree exceeds a prescribed level, the diagnosis unit of the battery diagnosis apparatus determines that abnormality has occurred in the largest block in the diagnosis target. The battery diagnosis apparatus can properly sense abnormality of the parallel cell block that makes up the battery assembly.

The diagnosis unit may make diagnosis (that is, determination as to whether or not abnormality has occurred in the largest block) described previously only when a prescribed diagnosis execution condition is satisfied. When at least one of a condition that the first SOC of the largest block is equal to or higher than a first threshold value, a condition that the second SOC of the largest block is equal to or lower than a second threshold value, and a condition that $\Delta$SOC of the largest block is equal to or smaller than a third threshold value is satisfied, the diagnosis unit may not make diagnosis described previously.

When the first SOC of the largest block is excessively high, when the second SOC of the largest block is excessively low, and when $\Delta$SOC of the largest block is excessively small, accuracy in diagnosis by the diagnosis unit tends to be low. According to the configuration, diagnosis is not made in such a case. According to such a configuration, accuracy in diagnosis (that is, diagnosis as to whether or not abnormality has occurred in the largest block) by the diagnosis unit can be improved.

The diagnosis unit may determine whether or not polarization has occurred in the battery assembly and make diagnosis described previously based on the SOC calculated by the SOC calculator in the absence of polarization.

When polarization occurs in the battery assembly, accuracy in estimation of the SOC tends to be low and accuracy in diagnosis described previously by the diagnosis unit tends to be low. According to the configuration, the diagnosis unit makes diagnosis described previously based on the SOC calculated by the SOC calculator in the absence of polarization. According to such a configuration, accuracy in diagnosis (that is, diagnosis as to whether or not abnormality has occurred in the largest block) by the diagnosis unit can be improved. When the diagnosis unit determines that polarization has occurred, the diagnosis unit may not make diagnosis described previously.

In the battery diagnosis apparatus described above, $\Delta SOC$ serves as a parameter that represents magnitude of deviation between a first SOC (an SOC at the time of start) and a second SOC (an SOC after end) when charging or discharging of the battery assembly is carried out. The $\Delta SOC$ deviation degree serves as a parameter that represents magnitude of a difference (magnitude of deviation) between $\Delta SOC$ of the largest block and the $\Delta SOC$ reference value. For example, a difference or a ratio can be adopted as a parameter that represents magnitude of deviation. As the difference (an absolute value) between $\Delta SOC$ and the $\Delta SOC$ reference value is larger, magnitude of deviation therebetween is large. As a ratio between $\Delta SOC$ and the $\Delta SOC$ reference value is closer to 1, magnitude of deviation therebetween is small.

$\Delta SOC$ may represent a difference between the first SOC and the second SOC. The diagnosis unit may determine whether or not the $\Delta SOC$ deviation degree has exceeded the prescribed level based on a ratio between $\Delta SOC$ of the largest block and the $\Delta SOC$ reference value.

According to the configuration, when a cell breaks away as described previously in any of the parallel cell blocks included in a high-capacity battery assembly, in which parallel cell block the cell has broken away can highly accurately be identified. The battery assembly may have a capacity equal to or higher than 100 Ah.

The $\Delta SOC$ reference value of the battery diagnosis apparatus described above serves as an indicator that indicates $\Delta SOC$ of a normal parallel cell block. The $\Delta SOC$ reference value may be a normal value (for example, a fixed value or a map value) found in experiments or simulations in advance, $\Delta SOC$ of a prescribed parallel cell block (more specifically, a parallel cell block other than the largest block), or an average $\Delta SOC$ of parallel cell blocks other than the largest block.

Any battery diagnosis apparatus described above may further include a second block identification unit. The second block identification unit identifies a second block. The second block refers to a parallel cell block second largest in $\Delta SOC$ in the diagnosis target. The $\Delta SOC$ reference value may be $\Delta SOC$ of the second block.

In the configuration, $\Delta SOC$ of the second block is adopted as the $\Delta SOC$ reference value. The degree of deviation between $\Delta SOC$ of the largest block and $\Delta SOC$ of the second block tends to be high when abnormality (that is, breakaway of a cell) occurs in the largest block, and tends to be close to 0 when the largest block is normal. According to such a configuration, abnormality of the largest block is readily sensed with high accuracy. When abnormality occurs simultaneously in two or more parallel cell blocks (for example, the largest block and the second block), a temperature of the battery assembly tends to greatly increase. The battery diagnosis apparatus may determine whether or not abnormality has occurred simultaneously in two or more parallel cell blocks based on the temperature of the battery assembly. When abnormality has occurred simultaneously in two or more parallel cell blocks, the battery diagnosis apparatus may not make diagnosis by the diagnosis unit.

The entire battery assembly or some of parallel cell blocks (more specifically, a plurality of parallel cell blocks) that make up the battery assembly may be defined as the diagnosis target in any battery diagnosis apparatus described above. In the battery assembly including at least fifty parallel cell blocks, a diagnosis target including at least five parallel cell blocks may be set. According to such a configuration, the battery assembly can efficiently be diagnosed.

A vehicle according to the present disclosure includes any battery diagnosis apparatus described above, the battery assembly, and the battery sensor.

According to the vehicle, any battery diagnosis apparatus described above can properly sense abnormality of a parallel cell block that makes up the battery assembly mounted on the vehicle.

The $\Delta SOC$ obtaining unit of the battery diagnosis apparatus may obtain $\Delta SOC$ for each of the parallel cell blocks included in the battery assembly when external charging of the battery assembly is carried out. The first SOC may be the SOC at the time of start of external charging. The second SOC may be the SOC after end of external charging.

In the vehicle, the battery assembly can be diagnosed when external charging is carried out. External charging means charging of the battery assembly with electric power supplied from the outside of the vehicle.

The $\Delta SOC$ obtaining unit of the battery diagnosis apparatus may obtain $\Delta SOC$ for each of the parallel cell blocks included in the battery assembly when external power feed with electric power of the battery assembly is carried out. The first SOC may be the SOC at the time of start of external power feed. The second SOC may be the SOC after end of external power feed.

In the vehicle, the battery assembly can be diagnosed when external power feed is carried out. External power feed means discharging of the battery assembly for supplying electric power stored in the battery assembly to the outside of the vehicle.

When a prescribed diagnosis execution condition is satisfied at timing of turn-on of a start-up switch of the vehicle, the diagnosis unit of the battery diagnosis apparatus may make diagnosis described previously. When at least one of a condition that a first time period is equal to or shorter than a fourth threshold value and a condition that a second time period is equal to or shorter than a fifth threshold value is satisfied, the diagnosis unit may not make diagnosis described previously. The first time period is a time period from turn-off of the start-up switch until start of charging or discharging involved with diagnosis. The second time period is a time period from end of charging or discharging involved with diagnosis until turn-on of the start-up switch.

At the time point of turn-off of the start-up switch of the vehicle, polarization may have occurred in the battery assembly. When charging or discharging of the battery assembly is carried out, polarization may occur in the battery assembly. When a sufficient time period has elapsed since occurrence of polarization in the battery assembly with charging and discharging of the battery assembly not being carried out, the battery assembly is depolarized. According to the configuration, when a prescribed diagnosis execution condition is satisfied at the timing of turn-on of the start-up switch of the vehicle, the diagnosis unit makes diagnosis. When a sufficient time period has not elapsed since turn-off of the start-up switch of the vehicle, diagnosis is not made. When a sufficient time period has not elapsed since end of charging and discharging of the battery assembly, diagnosis is not made either. According to such a configuration, lowering in accuracy in diagnosis due to lowering in accuracy in estimation of the SOC caused by polarization is suppressed.

While the vehicle is parked, the battery diagnosis apparatus mounted on the vehicle may diagnose the battery assembly with the diagnosis unit described previously, and while the vehicle is traveling, the battery diagnosis apparatus may make diagnosis of the battery assembly with a method different from the diagnosis unit described previously.

The battery sensor may include a plurality of voltage sensors provided in respective ones of all parallel cell blocks included in the diagnosis target. Output signals from the plurality of voltage sensors may be provided to the battery diagnosis apparatus through a common signal processing circuit. The SOC calculator of the battery diagnosis apparatus may calculate the SOC for each of the parallel cell blocks included in the battery assembly based on the output signals from the plurality of voltage sensors processed by the common signal processing circuit.

A detection error of the SOC may be produced during processing by the signal processing circuit. In the configuration, voltage signals from all parallel cell blocks included in the diagnosis target are processed by the same signal processing circuit (that is, the common signal processing circuit). Therefore, the SOC of each parallel cell block calculated by the SOC calculator contains the same error. Such an error becomes small as being canceled at the time of calculation of ΔSOC or the ΔSOC deviation degree.

Any vehicle described above may travel with electric power stored in the battery assembly. Any vehicle described above may be an electric vehicle (EV) or a plug-in hybrid vehicle (PHV).

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 10 is a diagram for illustrating a first example in which a threshold value used in diagnosis processing shown in FIG. 9 is variably set.

FIG. 11 is a diagram for illustrating a second example in which a threshold value used in diagnosis processing shown in FIG. 9 is variably set.

FIG. 12 is a diagram for illustrating an Example of the present disclosure.

DESCRIPTION OF THE PREFERRED EMBODIMENTS

Figure 1:
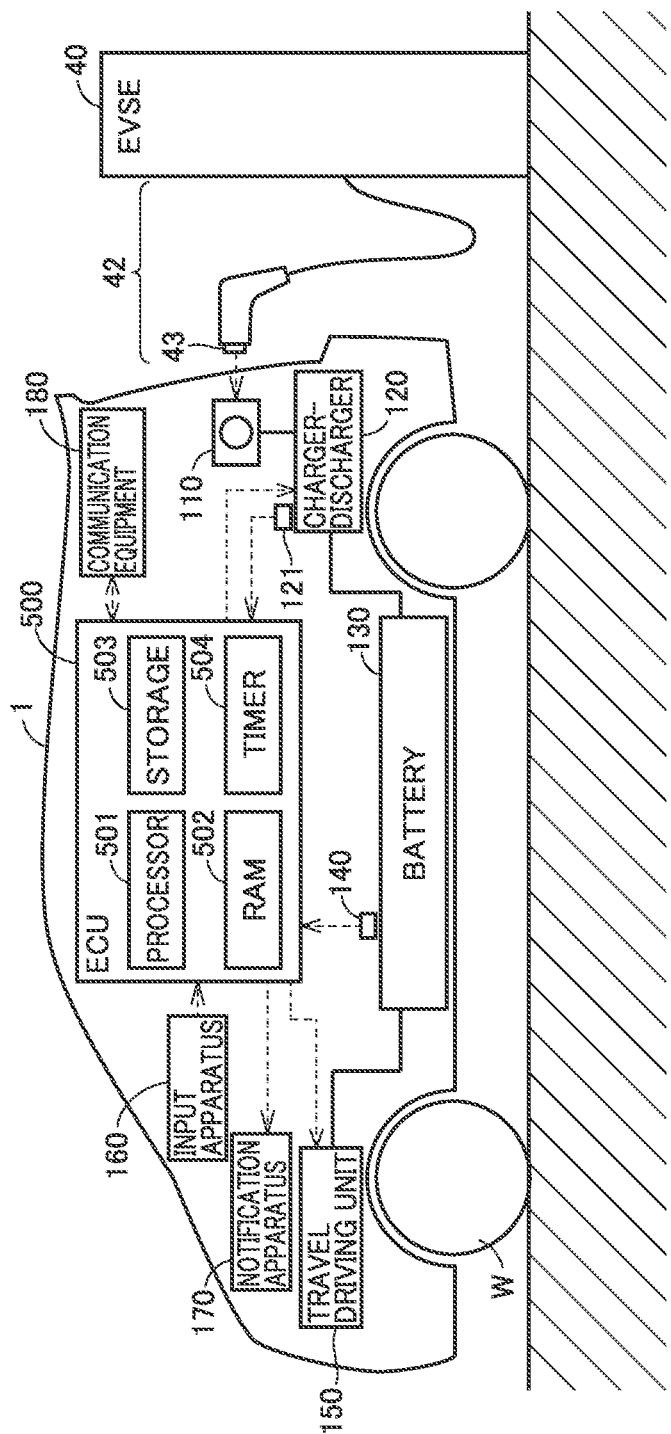
FIG. 1 is a diagram showing a schematic configuration of a vehicle according to an embodiment of the present disclosure.

An embodiment of the present disclosure will be described in detail with reference to the drawings. The same or corresponding elements in the drawings have the same reference characters allotted and description thereof will not be repeated. An electronic control unit may be denoted as an "ECU" below. Electric vehicle supply equipment may be denoted as "EVSE".

FIG. 1 is a diagram showing a schematic configuration of a vehicle according to this embodiment. Referring to FIG. 1, a vehicle 1 includes a battery 130 that stores electric power for traveling. Vehicle 1 may be an electric vehicle (EV) that can travel only with electric power stored in battery 130 or a plug-in hybrid vehicle (PHV) that can travel with both of electric power stored in battery 130 and output from an engine (not shown).

In this embodiment, battery 130 includes a battery assembly. The battery assembly is made up of a plurality of secondary batteries (that is, cells) electrically connected to one another. Any secondary battery can be adopted as the cell. In this embodiment, a lithium ion battery is adopted as the cell. The cell may be a secondary battery (for example, a nickel metal hydride battery) other than the lithium ion battery. The cell may be a liquid secondary battery or an all-solid-state battery. A specific configuration of the battery assembly included in battery 130 will be described later (see FIGS. 2 and 3).

Vehicle 1 includes an ECU 500. ECU 500 carries out charging control and discharging control of battery 130. ECU 500 controls communication with the outside of vehicle 1. Vehicle 1 further includes a monitoring module 140 that monitors a state of battery 130. Monitoring module 140 includes a battery sensor that detects a state of the battery assembly included in battery 130 and a signal processing circuit that processes an output signal from the battery sensor, and provides a sensor signal processed by the signal processing circuit to ECU 500. In this embodiment, a voltage sensor, a current sensor, and a temperature sensor that detect a voltage, a current, and a temperature of the battery assembly are adopted as the battery sensor. For example, a general-purpose integrated circuit (IC) can be adopted as the signal processing circuit. ECU 500 can obtain a state (for example, a temperature, a current, a voltage, a state of charge (SOC), and an internal resistance) of the battery assembly based on an output from monitoring module 140. A specific configuration of monitoring module 140 will be described later (see FIGS. 2 and 3).

Vehicle 1 includes an inlet 110 and a charger-discharger 120 adapted to a power feed type of EVSE 40. Inlet 110 receives electric power supplied from the outside of vehicle 1. Inlet 110 outputs electric power supplied from charger-discharger 120 to the outside of vehicle 1. Though FIG. 1 shows only inlet 110 and charger-discharger 120, vehicle 1 may include an inlet and a charger-discharger for each power feed type so as to adapt to a plurality of power feed types (for example, an alternating-current (AC) type and a direct-current (DC) type).

A charging cable 42 is connected to EVSE 40. Charging cable 42 may always be connected to EVSE 40 or may be attachable to and removable from EVSE 40. Charging cable 42 includes a connector 43 at its tip end and contains a power line. Connector 43 of charging cable 42 can be connected to inlet 110. As connector 43 of charging cable 42 connected to EVSE 40 is connected to inlet 110 of vehicle 1, EVSE 40 and vehicle 1 are electrically connected to each other. Electric power can thus be supplied from EVSE 40 through charging cable 42 to vehicle 1.

Charger-discharger 120 is located between inlet 110 and battery 130. Charger-discharger 120 includes a relay that switches between connection and disconnection of an electric power path from inlet 110 to battery 130 and a power conversion circuit (neither of which is shown). For example, a bidirectional converter can be adopted as the power conversion circuit. Each of the relay and the power conversion circuit included in charger-discharger 120 is controlled by ECU 500. Vehicle 1 further includes a monitoring module 121 that monitors a state of charger-discharger 120. Monitoring module 121 includes various sensors that detect a state (for example, a voltage, a current, and a temperature) of charger-discharger 120 and outputs a result of detection to ECU 500. In this embodiment, monitoring module 121 detects a voltage and a current input to and output from the power conversion circuit.

As EVSE 40 located outside vehicle 1 and inlet 110 of vehicle 1 are connected to each other through charging cable 42, electric power can be supplied and received between EVSE 40 and vehicle 1. Therefore, external charging by vehicle 1 can be carried out (that is, electric power can be supplied from the outside of vehicle 1 to charge battery 130 of vehicle 1). Electric power for external charging is supplied, for example, from EVSE 40 through charging cable 42 to inlet 110. Charger-discharger 120 converts electric power received at inlet 110 into electric power suitable for charging of battery 130 and outputs resultant electric power to battery 130. As EVSE 40 and inlet 110 are connected to each other through charging cable 42, external power feed by vehicle 1 (that is, power feed from vehicle 1 through charging cable 42 to EVSE 40) can be carried out. Electric power for external power feed is supplied from battery 130 to charger-discharger 120. Charger-discharger 120 converts electric power supplied from battery 130 into electric power suitable for external power feed and outputs resultant electric power to inlet 110. When any of external charging and external power feed is performed, the relay of charger-discharger 120 is closed (connected), and when neither of external charging and external power feed is performed, the relay of charger-discharger 120 is opened (disconnected).

The configuration of charger-discharger 120 is not limited as above and can be modified as appropriate. Charger-discharger 120 may include, for example, at least one of a rectification circuit, a power factor correction (PFC) circuit, an insulating circuit (for example, an insulating transformer), an inverter, and a filter circuit. When vehicle 1 carries out external power feed to AC type EVSE, charger-discharger 120 may subject electric power discharged from battery 130 to DC/AC conversion and resultant AC power may be supplied from vehicle 1 to the EVSE. When vehicle 1 carries out external power feed to DC type EVSE, vehicle 1 may supply DC power to the EVSE and an inverter contained in the EVSE may carry out DC/AC conversion.

ECU 500 includes a processor 501, a random access memory (RAM) 502, a storage 503, and a timer 504. For example, a central processing unit (CPU) can be adopted as processor 501. RAM 502 functions as a work memory that temporarily stores data to be processed by processor 501. Storage 503 can store information that is put thereinto. Storage 503 includes, for example, a read only memory (ROM) and a rewritable non-volatile memory. Storage 503 stores not only a program but also information (for example, a map, a mathematical expression, and various parameters) to be used by a program. As a program stored in storage 503 is executed by processor 501, various types of control by ECU 500 are carried out in this embodiment. Various types of control by ECU 500 are not limited to control carried out by software but can also be carried out by dedicated hardware (electronic circuitry). Any number of processors may be provided in ECU 500 and a processor may be prepared for each prescribed type of control.

Timer 504 notifies processor 501 that the set time has come. As the time set in timer 504 comes, timer 504 transmits a signal to that effect to processor 501. In this embodiment, a timer circuit is adopted as timer 504. Timer 504 may be implemented by software instead of hardware (timer circuitry). ECU 500 can obtain current time from a real time clock (RTC) circuit (not shown) contained in ECU 500.

Vehicle 1 further includes a travel driving unit 150, an input apparatus 160, a notification apparatus 170, communication equipment 180, and a drive wheel W. Vehicle 1 is not limited to a front-wheel-drive vehicle shown in FIG. 1 and it may be a rear-wheel-drive vehicle or a four-wheel-drive vehicle.

Travel driving unit 150 includes a not-shown power control unit (PCU) and a motor generator (MG), and allows vehicle 1 to travel with electric power stored in battery 130. The PCU includes, for example, a controller including a processor, an inverter, a converter, and a relay (which is referred to as a "system main relay (SMR)" below) (none of which is shown). The controller of the PCU receives an instruction (a control signal) from ECU 500 and controls the inverter, the converter, and the SMR of the PCU in accordance with the instruction. The MG is implemented, for example, by a three-phase AC motor generator. The MG is driven by the PCU and rotates drive wheel W. The MG performs regeneration and supplies regenerated electric power to battery 130. The SMR switches between connection and disconnection of an electric power path from battery 130 to the PCU. The SMR is closed (connected) when vehicle 1 travels.

Input apparatus 160 accepts an input from a user. Input apparatus 160 is operated by a user and outputs a signal corresponding to the operation by the user to ECU 500. Communication may be wired or wireless. Examples of input apparatus 160 include various switches, various pointing devices, a keyboard, and a touch panel. An operation portion of a car navigation system may be adopted as input apparatus 160. A smart speaker that accepts audio input may be adopted as input apparatus 160.

Notification apparatus 170 performs prescribed processing for giving a notification to a user (for example, a driver and/or a passenger of vehicle 1) when a request is given from ECU 500. Notification apparatus 170 may include at least one of a display apparatus (for example, a touch panel display), a speaker, and a lamp (for example, a malfunction indicator lamp (MIL)). Notification apparatus 170 may be implemented by a meter panel, a head-up display, or a car navigation system.

Communication equipment 180 includes various communication interfaces (I/F). Communication equipment 180 may include a data communication module (DCM). ECU 500 wirelessly communicates with a communication apparatus outside vehicle 1 through communication equipment 180.

Figure 2:
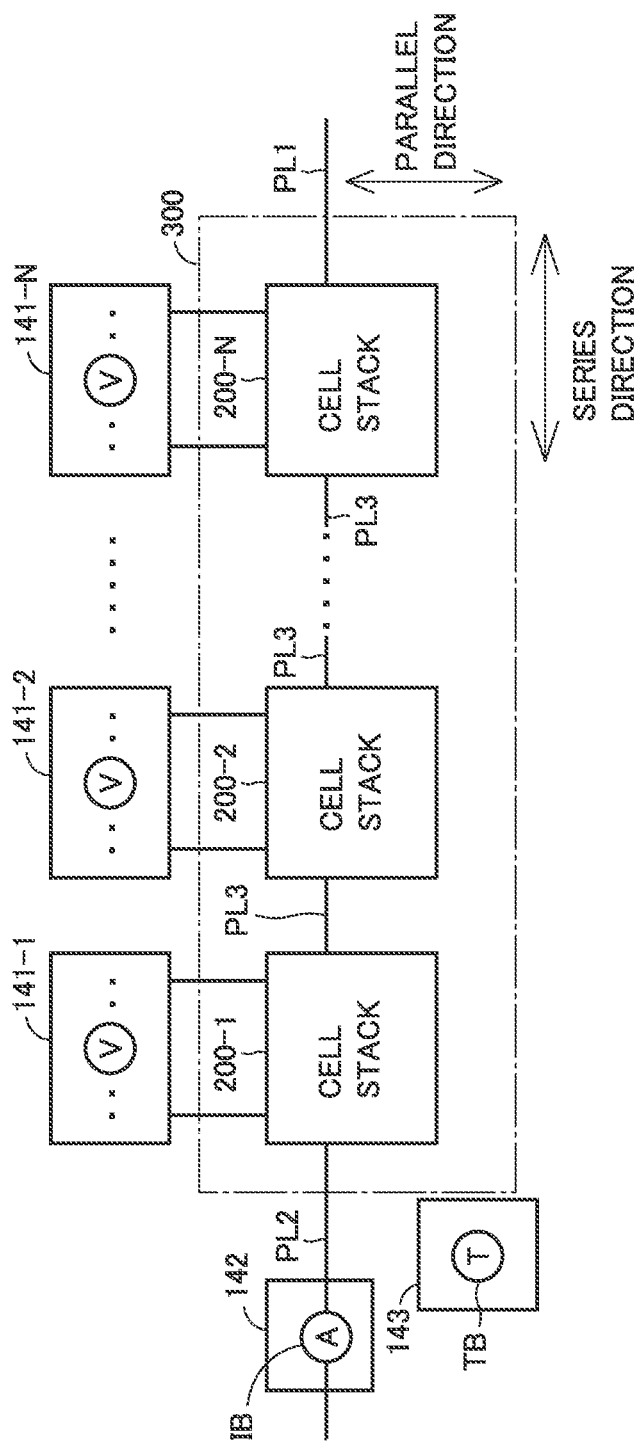
FIG. 2 is a diagram showing a configuration of each of a battery assembly and a monitoring module included in a battery shown in FIG. 1.

FIG. 2 is a diagram showing a configuration of each of the battery assembly and monitoring module 140 included in battery 130. Referring to FIG. 2 together with FIG. 1, battery 130 includes a battery assembly 300. Battery assembly 300 includes N cell stacks (that is, cell stacks 200-1 to 200-N). N may be not smaller than five or not smaller than thirty. In this embodiment, N is set to ten. Monitoring module 140 includes N voltage detection circuits (that is, voltage detection circuits 141-1 to 141-N), a single current detection circuit 142, and a single temperature detection circuit 143. Current detection circuit 142 incorporates a current sensor IB that detects a current that flows to cell stacks 200-1 to 200-N. Current detection circuit 142 processes an output signal from current sensor IB. Temperature detection circuit 143 incorporates a temperature sensor TB that detects a temperature of battery assembly 300. Temperature detection circuit 143 processes an output signal from temperature sensor TB. In this embodiment, single current sensor IB and single temperature sensor TB are included in monitoring module 140. Without being limited as such, the number of current sensors IB and temperature sensors TB can be modified as appropriate. For example, temperature sensor TB may be provided for each cell stack, each parallel cell block, or each cell.

Figure 3:
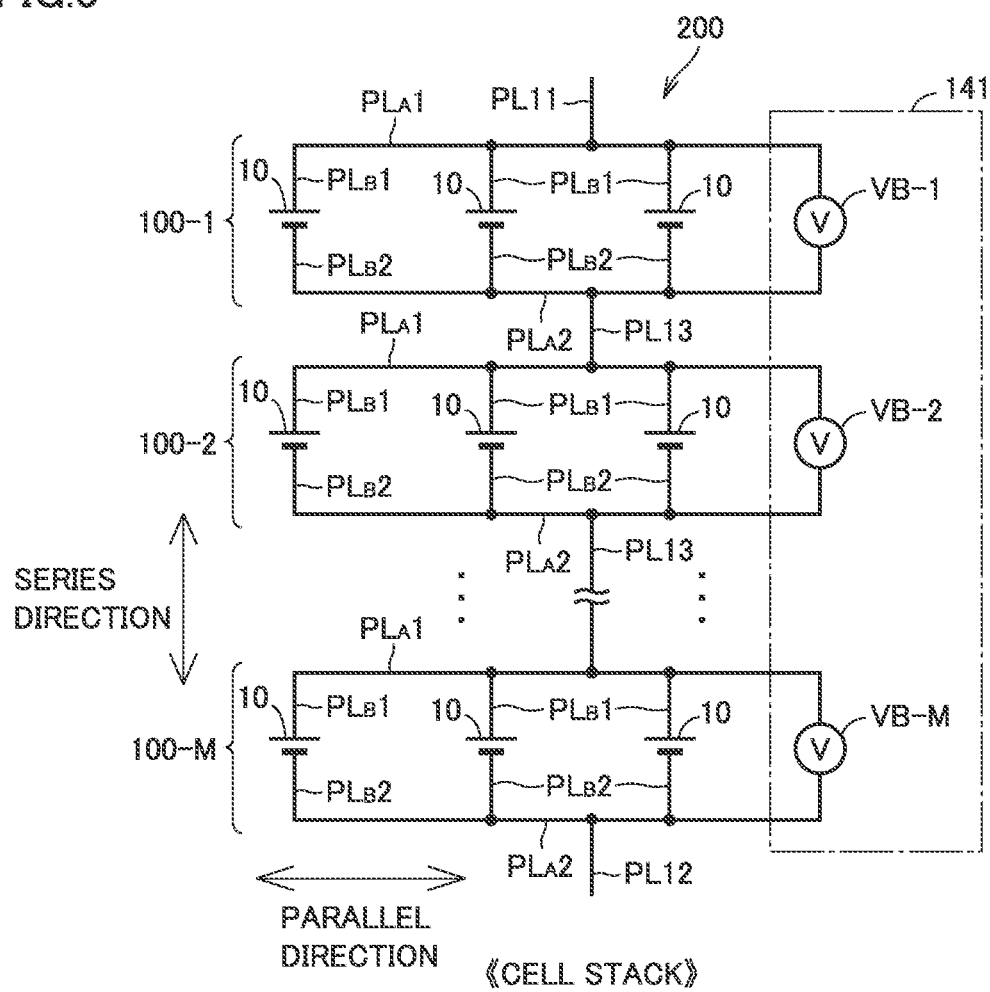
FIG. 3 is a diagram showing a configuration of each of a cell stack and a voltage detection circuit shown in FIG. 2.

Voltage detection circuits 141-1 to 141-N are provided for cell stacks 200-1 to 200-N, respectively. Each of cell stacks 200-1 to 200-N is referred to as a "cell stack 200" and each of voltage detection circuits 141-1 to 141-N is referred to as a "voltage detection circuit 141" below, unless they are described as being distinguished from one another. FIG. 3 is a diagram showing a configuration of each of cell stack 200 and voltage detection circuit 141.

Referring to FIG. 3, cell stack 200 includes M parallel cell blocks (that is, parallel cell blocks 100-1 to 100-M). M voltage sensors (that is, voltage sensors VB-1 to VB-M) are mounted on single voltage detection circuit 141. Voltage sensors VB-1 to VB-M detect voltages across terminals of parallel cell blocks 100-1 to 100-M, respectively. M may be not smaller than five or not smaller than thirty. In this embodiment, M is set to ten. Each of parallel cell blocks 100-1 to 100-M is referred to as a "parallel cell block 100" below, unless they are described as being distinguished from one another.

Parallel cell blocks 100-1 to 100-M are connected in series with power lines PL13 being interposed. Each power line PL13 connects in series, parallel cell blocks 100 adjacent in cell stack 200. Power lines PL11 and PL12 are power lines for connection between cell stack 200 and the outside. In this embodiment, power line PL11 is a power line on a positive electrode side of cell stack 200 and power line PL12 is a power line on a negative electrode side of cell stack 200.

Each parallel cell block 100 includes a plurality of cells 10 (in this embodiment, lithium ion batteries) connected in parallel. Though any number of cells 10 may be included in each parallel cell block 100, three cells 10 are included in this embodiment. In each parallel cell block 100, three cells 10 are connected in parallel through power lines $PL_A1$, $PL_A2$, $PL_B1$, and $PL_B2$. Each of power lines $PL_A1$, $PL_A2$, $PL_B1$, and $PL_B2$ may be made from a wire or a metal plate (for example, a bus bar). A fuse (not shown) may be provided in each $PL_B1$ or each $PL_B2$ included in parallel cell block 100.

Power lines $PL_A1$ and $PL_A2$ are power lines in a parallel direction and power lines $PL_B1$ and $PL_B2$ are power lines in a series direction. In parallel cell block 100-1, power line $PL_A1$ is connected to power line PL11 in the series direction. In each of parallel cell blocks 100-2 to 100-M, power line $PL_A1$ is connected to power line $PL_A2$ in adjacent parallel cell block 100 with power line PL13 in the series direction being interposed. Each power line $PL_B1$ electrically connects a positive electrode terminal of each cell 10 and power line $PL_A1$ to each other. Each power line $PL_B2$ electrically connects a negative electrode terminal of each cell 10 and power line $PL_A2$ to each other. In parallel cell block 100-M, power line $PL_A2$ is connected to power line PL12 in the series direction. In each of other parallel cell blocks 100 (that is, parallel cell blocks 100-1 to 100-M−1), power line $PL_A2$ is connected to power line $PL_A1$ in adjacent parallel cell block 100 with power line PL13 in the series direction being interposed.

As set forth above, in this embodiment, cell stacks 200-1 to 200-N are identical in configuration (that is, the configuration shown in FIG. 3). Each of cell stacks 200-1 to 200-N is constituted of M (ten in this embodiment) parallel cell blocks 100. Each of M parallel cell blocks 100 that make up each cell stack 200 is made up of three cells 10 connected in parallel. Without being limited as such, cell stacks 200-1 to 200-N may be different in configuration from one another. The number of cells included in one parallel cell block is not limited to three, and any number of cells may be included in one parallel cell block. For example, each parallel cell block may include five or more cells. The parallel cell blocks may be different from one another in number of cells.

Referring again to FIG. 2, cell stacks 200-1 to 200-N connected in series make up battery assembly 300. Battery assembly 300 includes N×M parallel cell blocks 100. Fifty or more parallel cell blocks or one hundred or more parallel cell blocks may be included in battery assembly 300. In this embodiment, one hundred parallel cell blocks are included in battery assembly 300. Battery assembly 300 may have a capacity not lower than 30 Ah or not lower than 100 Ah. In this embodiment, battery assembly 300 has a capacity of 150 Ah. Power lines PL1 and PL2 are power lines for connection between battery assembly 300 and the outside. In this embodiment, power line PL1 is a power line on the positive electrode side of battery assembly 300 and power line PL2 is a power line on the negative electrode side of battery assembly 300. Power line PL1 corresponds to power line PL11 (FIG. 3) of cell stack 200-N. Power line PL2 corresponds to power line PL12 (FIG. 3) of cell stack 200-1. In this embodiment, current sensor IB is arranged in power line PL2. Without being limited as such, current sensor IB may be arranged in power line PL1. Current sensor IB detects a total current that flows through all cells 10 that make up each parallel cell block 100.

When break (including blowout of a fuse) or loosening of a fastener occurs in power line $PL_B1$ or $PL_B2$ in parallel cell block 100 shown in FIG. 3, cell 10 breaks away from parallel cell block 100 and the number of cells 10 properly connected in parallel cell block 100 decreases. When cell 10 breaks away from parallel cell block 100, the SOC of parallel cell block 100 tends to be varied by charging or discharging of parallel cell block 100.

For example, when one power line $PL_B1$ breaks in parallel cell block 100, during charging or discharging of parallel cell block 100, no current flows to one cell 10 and the current flows only to two remaining cells 10. Thus, magnitude of the current that flows per one cell during charging or discharging is approximately 1.5 time as high as that in a normal condition (that is, when no cell has broken away). When one cell 10 breaks away from parallel cell block 100, the capacity (that is, an amount of stored power in a fully charged state) of parallel cell block 100 is approximately two thirds of the capacity in the normal condition, and hence the SOC of parallel cell block 100 tends to be varied by charging or discharging of parallel cell block 100.

When a cell breaks away as set forth above, variation of the SOC due to charging or discharging of parallel cell block 100 becomes great. As the SOC of parallel cell block 100 is higher, an open circuit voltage (OCV) of parallel cell block 100 tends to be higher. Depending on a capacity, a state of power storage, or a status of charging or discharging of battery assembly 300, however, the OCV of parallel cell block 100 may hardly vary in spite of break-away of the cell.

Figure 4:
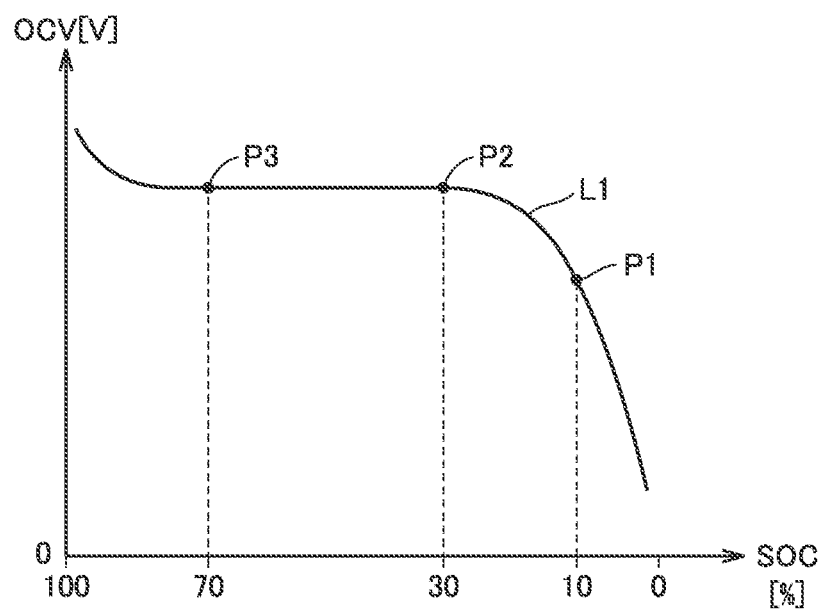
FIG. 4 is a diagram showing exemplary relation between an SOC and an OCV of a parallel cell block.

FIG. 4 is a diagram showing exemplary relation between an SOC and an OCV of a parallel cell block. Referring to FIG. 4, the SOC and the OCV of parallel cell block 100 satisfy relation as shown with a line Li. For example, when charging for increasing the SOC of parallel cell block 100 from 10% to 30% is carried out while parallel cell block 100 is normal, the SOC and the OCV of parallel cell block 100 increases from a value indicated by a point P1 to a value indicated by a point P2. When abnormality (that is, break-away of a cell) occurs in parallel cell block 100 in similar charging, the SOC and the OCV of parallel cell block 100 increase from the value indicated by point P1 to a value indicated by a point P3.

In the example shown in FIG. 4, the OCV indicated by point P2 is not much different from the OCV indicated by point P3. Therefore, a difference (that is, ΔOCV) between a first OCV which is the OCV at the time of start of charging and a second OCV which is the OCV after end of charging hardly varies even though abnormality (that is, break-away of a cell) occurs in parallel cell block 100. In contrast, a difference (that is, ΔSOC) between a first SOC which is the SOC at the time of start of charging and a second SOC which is the SOC after end of charging is 20% (=30%−10%) in the normal condition, whereas it is 60% (=70%−10%) in an abnormal condition. ΔSOC is greatly different between the normal condition and the abnormal condition. In the abnormal condition, ΔSOC (that is, variation in SOC of parallel cell block 100 due to charging of battery assembly 300) of parallel cell block 100 is greater than in the normal condition. ECU 500 according to this embodiment highly accurately senses abnormality of each parallel cell block 100 that makes up battery assembly 300 based on ΔSOC.

Figure 5:
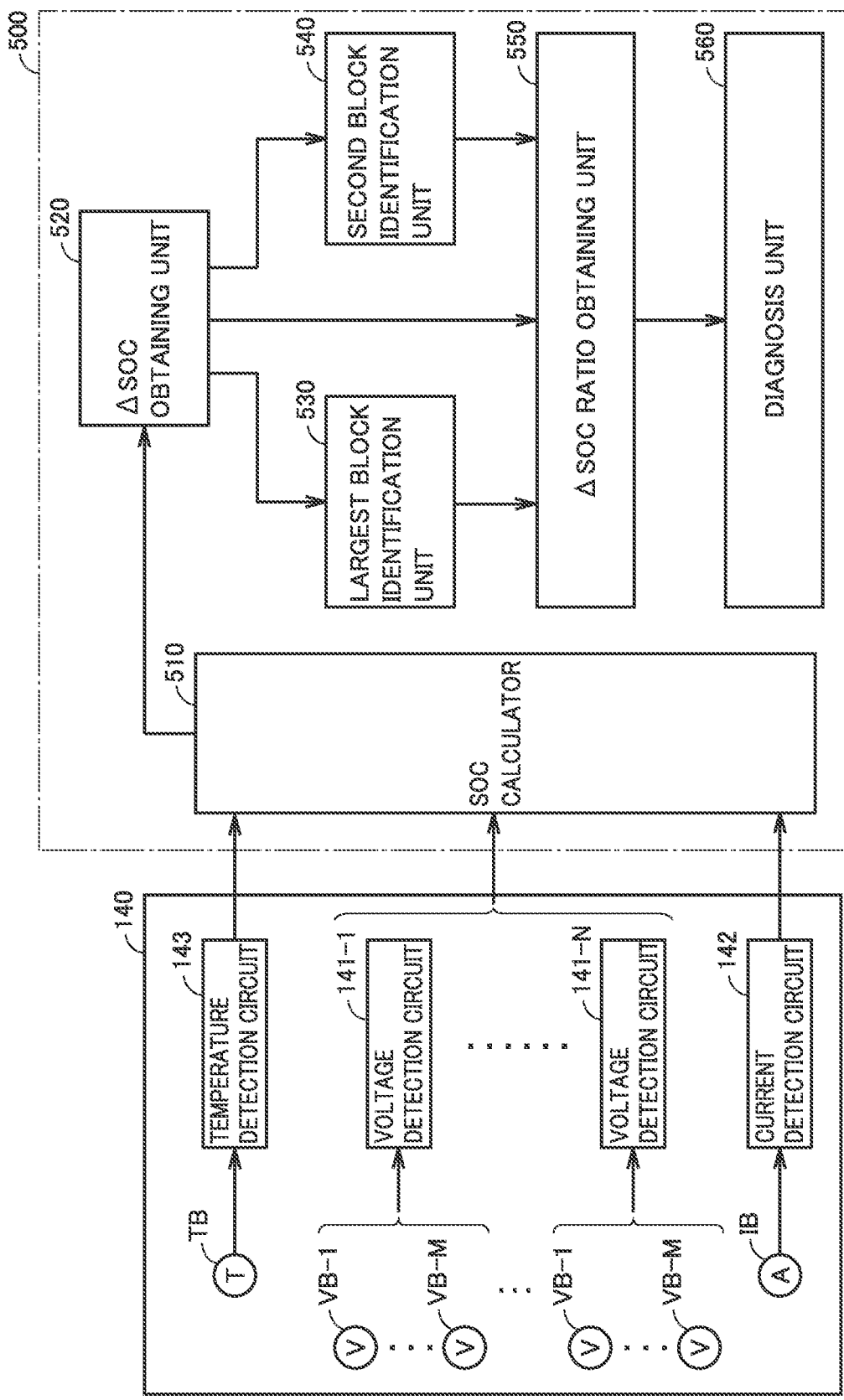
FIG. 5 is a diagram showing a detailed configuration of a battery diagnosis apparatus according to the embodiment of the present disclosure.

FIG. 5 is a diagram showing a detailed configuration of ECU 500. ECU 500 corresponds to an exemplary "battery diagnosis apparatus" according to the present disclosure. Referring to FIG. 5 together with FIGS. 1 to 3, ECU 500 includes an SOC calculator 510, a ΔSOC obtaining unit 520, a largest block identification unit 530, a second block identification unit 540, a ΔSOC ratio obtaining unit 550, and a diagnosis unit 560. In this embodiment, each of these components is implemented by processor 501 shown in FIG. 1 and a program executed by processor 501. Without being limited as such, each of these components may be implemented by dedicated hardware (electronic circuitry).

SOC calculator 510 calculates an SOC of each parallel cell block 100 included in battery assembly 300 based on information transmitted from monitoring module 140 to ECU 500. An output signal from each of voltage sensors VB-1 to VB-M (see FIG. 3) is sent to SOC calculator 510 through common voltage detection circuit 141. Each voltage detection circuit 141 processes M sensor signals and provides them to SOC calculator 510. In this embodiment, voltage detection circuit 141 corresponds to an exemplary "common signal processing circuit" according to the present disclosure. An output signal from current sensor IB (see FIG. 2) is provided to SOC calculator 510 through current detection circuit 142. An output signal from temperature sensor TB (see FIG. 2) is provided to SOC calculator 510 through temperature detection circuit 143. In this embodiment, SOC calculator 510 calculates an SOC for each parallel cell block 100 included in battery assembly 300 (FIG. 2) based on output signals from voltage sensors VB-1 to VB-M processed by voltage detection circuit 141, an output signal from current sensor IB processed by current detection circuit 142, and an output signal from temperature sensor TB processed by temperature detection circuit 143.

Any logic for SOC calculator 510 to calculate the SOC is applicable. For example, SOC calculation information may be stored in advance in storage 503. The SOC calculation information represents relation among the OCV of parallel cell block 100, the current of battery assembly 300, the temperature of battery assembly 300, and the SOC of parallel cell block 100. SOC calculator 510 may calculate by referring to the SOC calculation information, the SOC of parallel cell block 100 based on the OCV of parallel cell block 100, the current of battery assembly 300, and the temperature of battery assembly 300.

ΔSOC obtaining unit 520 obtains ΔSOC for each parallel cell block 100 included in battery assembly 300 when external charging (that is, charging of battery assembly 300 with electric power supplied from the outside of vehicle 1) of battery assembly 300 is carried out. In this embodiment, a difference (=the second SOC−the first SOC) between the first SOC and the second SOC is adopted as ΔSOC. The first SOC refers to the SOC at the time of start of external charging. The second SOC refers to the SOC after end of external charging. ΔSOC obtaining unit 520 obtains the first SOC and the second SOC for each parallel cell block 100 from SOC calculator 510 and calculates ΔSOC for each parallel cell block 100 based on the obtained information.

In this embodiment, the voltage sensor (that is, voltage sensors VB-1 to VB-M) is provided (see FIG. 3) in all parallel cell blocks (that is, parallel cell blocks 100-1 to 100-M) included in a diagnosis target (that is, cell stack 200). Output signals from voltage sensors VB-1 to VB-M are provided to ECU 500 through the common signal processing circuit (voltage detection circuit 141). SOC calculator 510 calculates the SOC of each parallel cell block 100 included in the diagnosis target based on the output signals from the battery sensors processed by the common signal processing circuit. Therefore, the SOC of each parallel cell block calculated by SOC calculator 510 contains the same error. Such an error is canceled at the time of calculation of ΔSOC by ΔSOC obtaining unit 520. The error is canceled also at the time when ΔSOC ratio obtaining unit 550 calculates a ΔSOC ratio which will be described later.

Largest block identification unit 530 identifies a largest block based on information (including ΔSOC of each parallel cell block 100) obtained from ΔSOC obtaining unit 520. The largest block refers to parallel cell block 100 largest in ΔSOC in the diagnosis target set as a part or the entirety of battery assembly 300. In this embodiment, each cell stack 200 is defined as the diagnosis target. Largest block identification unit 530 identifies the largest block for each cell stack 200. Since battery assembly 300 (see FIG. 2) includes N (ten in this embodiment) cell stacks 200, largest block identification unit 530 identifies N largest blocks.

Second block identification unit 540 identifies a second block based on the information (including ΔSOC of each parallel cell block 100) obtained from ΔSOC obtaining unit 520. The second block refers to parallel cell block 100 second largest in ΔSOC in the diagnosis target (cell stack 200) described previously. Second block identification unit 540 identifies the second block for each cell stack 200. Second block identification unit 540 identifies N second blocks.

ΔSOC ratio obtaining unit 550 calculates a ΔSOC ratio for each diagnosis target (cell stack 200) based on information (including ΔSOC of each parallel cell block 100 and the largest block and the second block in each cell stack 200) obtained from ΔSOC obtaining unit 520, largest block identification unit 530, and second block identification unit 540. The ΔSOC ratio refers to a value (=ΔSOC of the largest block/ΔSOC of the second block) calculated by dividing ΔSOC of the largest block by ΔSOC of the second block. In this embodiment, ΔSOC of the second block corresponds to an exemplary "ΔSOC reference value" according to the present disclosure. The ΔSOC ratio corresponds to an exemplary "ΔSOC deviation degree."

Diagnosis unit 560 diagnoses battery assembly 300 based on information (including the ΔSOC ratio of each cell stack 200) obtained from ΔSOC ratio obtaining unit 550. Diagnosis unit 560 determines whether or not abnormality has occurred for each diagnosis target (cell stack 200). When the ΔSOC ratio of the diagnosis target is equal to or higher than a prescribed value, diagnosis unit 560 determines that abnormality has occurred in the largest block in the diagnosis target. In this embodiment, only when a prescribed diagnosis execution condition is satisfied, diagnosis unit 560 makes diagnosis above (that is, determination as to whether or not abnormality has occurred in the largest block in each diagnosis target). Details of the diagnosis execution condition will be described later (see FIG. 7).

Figure 6:
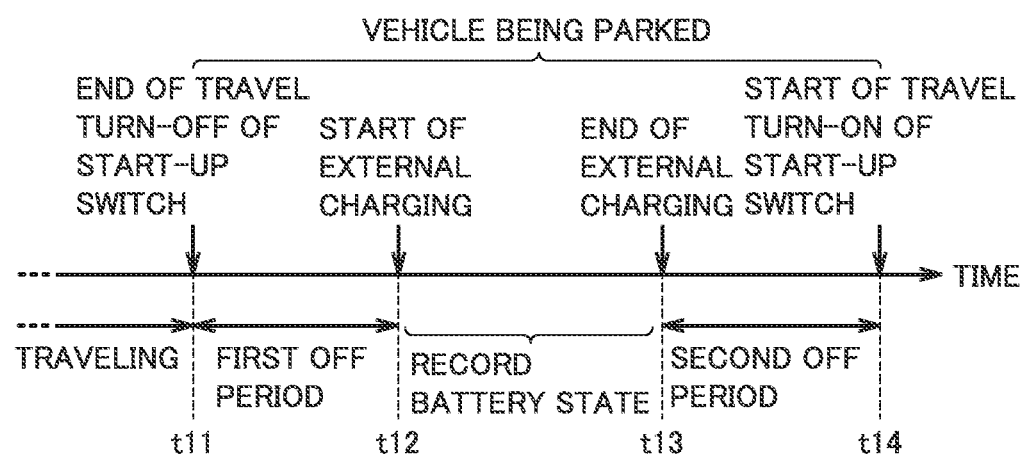
FIG. 6 is a diagram for illustrating exemplary timing at which the battery diagnosis apparatus shown in FIG. 5 diagnoses the battery assembly.

FIG. 6 is a diagram for illustrating exemplary timing at which ECU 500 diagnoses battery assembly 300.

Referring to FIG. 6 together with FIGS. 1 and 5, input apparatus 160 shown in FIG. 1 includes a start-up switch of vehicle 1. The start-up switch is a switch for starting up a vehicle system. As the start-up switch is turned on, the vehicle system is started up. In general, the start-up switch is referred to as a "power switch" or an "ignition switch." As will be described below, a user can switch between an on state (a Ready-ON state) and an off state (a Ready-OFF state) of the vehicle system by operating the start-up switch.

The start-up switch is operated, for example, at the time of start or end of drive of vehicle 1. While vehicle 1 is traveling, the vehicle system is in the on state (Ready-ON state). In the example shown in FIG. 6, when the user quits travel of vehicle 1, the user brings vehicle 1 to a standstill, applies a parking brake (not shown), sets a shift range to a P range, and thereafter sets the vehicle system to the Ready-OFF state by pressing the start-up switch at timing t11. When the vehicle system is switched from the Ready-ON state to the Ready-OFF state, ECU 500 sets the SMR to an open state to disconnect an electric power path from battery assembly 300 to the PCU. In the Ready-OFF state, ECU 500 enters the off state (for example, a sleep state). Timing t11 and timings t12 to t14 which will be described later are recorded in storage 503.

Thereafter, preparation (for example, connection of charging cable 42 to inlet 110) for external charging is made and external charging is started at timing t12. A period from timing t11 until timing t12 is also referred to as a "first OFF period" below. A duration of the first OFF period corresponds to a time period from turn-off of the start-up switch until start of external charging.

SOC calculator 510 calculates the SOC of each parallel cell block 100 based on an output from the battery sensor (more specifically, voltage sensors VB-1 to VB-M, current sensor IB, and temperature sensor TB) immediately before start of external charging. An output signal from each sensor is provided to SOC calculator 510 through the signal processing circuit (more specifically, voltage detection circuits 141-1 to 141-N, current detection circuit 142, and temperature detection circuit 143). SOC calculator 510 obtains the OCV of each parallel cell block 100 based on an output from each of voltage detection circuits 141-1 to 141-N. SOC calculator 510 obtains the current and the temperature of battery assembly 300 based on an output from each of current detection circuit 142 and temperature detection circuit 143. SOC calculator 510 calculates the SOC of each parallel cell block 100 based on the OCV of each parallel cell block 100, the current of battery assembly 300, and the temperature of battery assembly 300, for example, by referring to the SOC calculation information. The SOC obtained at this time corresponds to the first SOC. The first SOC of each parallel cell block 100 is stored in storage 503.

External charging started at timing t12 ends at timing t13. When a battery assembly of a high capacity (for example, not lower than 100 Ah) is employed for a vehicle, the battery assembly is not fully charged by one charging in many cases. During external charging (that is, during a period from timing t12 to timing t13), monitoring module 140 may successively detect a state of battery assembly 300 in real time. Results of detection may be recorded in storage 503. ECU 500 may determine whether or not battery assembly 300 is abnormal based on obtained information. For example, ECU 500 may determine whether or not battery assembly 300 is abnormal based on the temperature of battery assembly 300 detected by temperature sensor TB. When the temperature of battery assembly 300 is equal to or higher than a prescribed value (that is, battery assembly 300 excessively generates heat), ECU 500 may determine battery assembly 300 as being abnormal. When abnormality is sensed, ECU 500 may give a notification about abnormality and/or record abnormality.

Thereafter, when the user presses the start-up switch at timing t14 while the user presses a brake pedal (not shown), the vehicle system (and ECU 500) is started up and the Ready-ON state is set. In the Ready-ON state, the SMR is closed by ECU 500 and electric power is supplied from battery assembly 300 to the PCU, so that vehicle 1 enters a travelable state. A period from timing t13 until timing t14 is also referred to as a "second OFF period" below. A duration of the second OFF period corresponds to a time period from end of external charging until turn-on of the start-up switch.

After end of external charging, for example, at timing t14, SOC calculator 510 calculates the SOC of each parallel cell block 100 based on an output from the battery sensor (more specifically, voltage sensors VB-1 to VB-M, current sensor IB, and temperature sensor TB). The SOC obtained at this time corresponds to the second SOC. The second SOC of each parallel cell block 100 is stored in storage 503. The method of calculating the second SOC is the same, for example, as the method of calculating the first SOC described previously.

At timing t14 (that is, the timing of turn-on of the start-up switch of vehicle 1), diagnosis unit 560 determines whether or not the prescribed diagnosis execution condition is satisfied, and when the prescribed diagnosis execution condition is satisfied, diagnosis unit 560 makes diagnosis of battery assembly 300 described previously.

Figure 7:
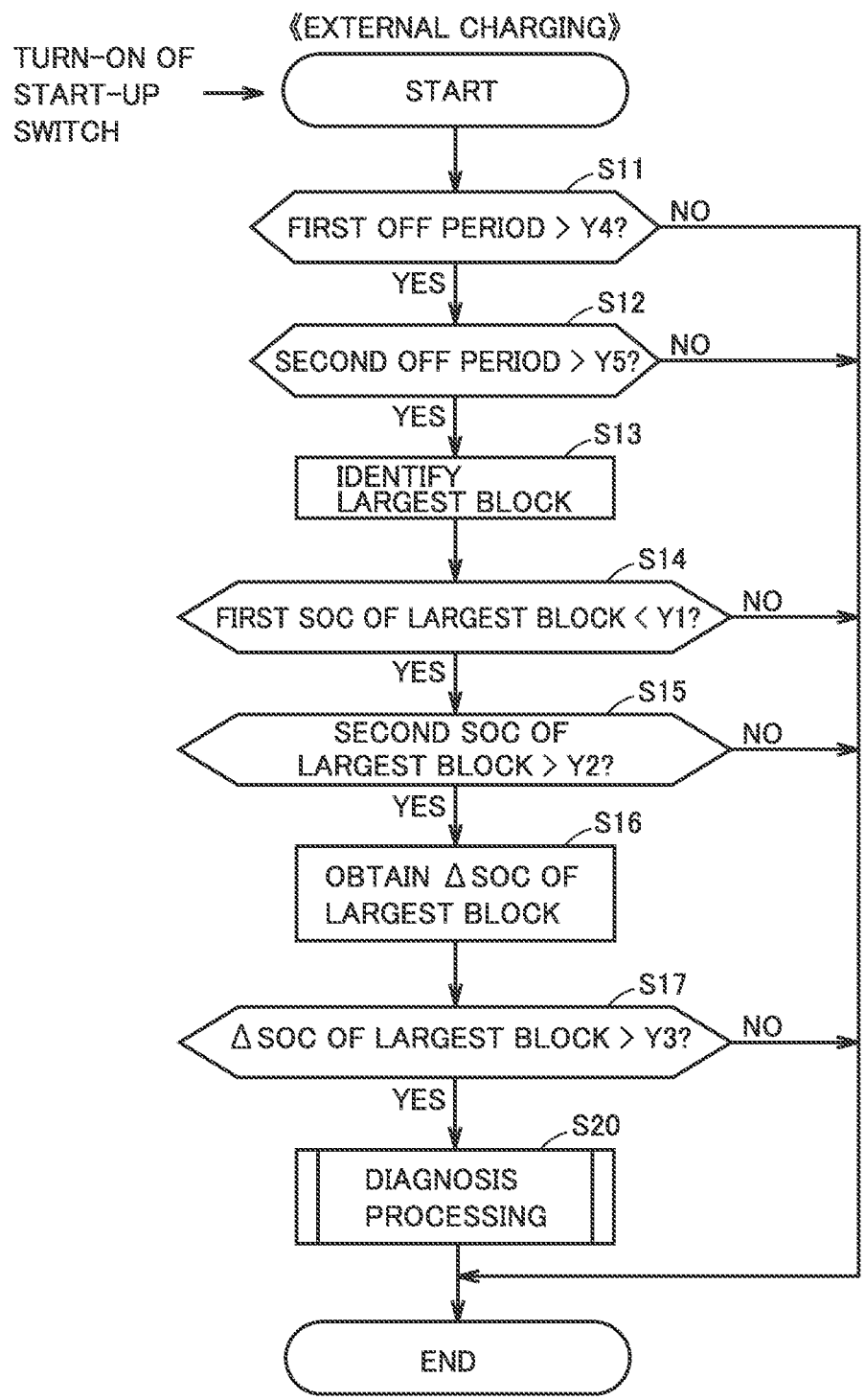
FIG. 7 is a flowchart showing a battery diagnosis method according to the embodiment of the present disclosure.

FIG. 7 is a flowchart showing a battery diagnosis method according to this embodiment. Processing shown in this flowchart is started at timing of turn-on of the start-up switch after end of external charging of battery assembly 300. The start timing may be, for example, timing t14 shown in FIG. 6. Diagnosis of battery assembly 300 is made for each diagnosis target (cell stack 200). Though diagnosis processing will be described below with attention being paid to one diagnosis target, similar diagnosis processing is performed also on other diagnosis targets.

Referring to FIG. 7 together with FIG. 5, diagnosis unit 560 determines whether or not the prescribed diagnosis execution condition is satisfied in a step (which is simply denoted as "S" below) 11 to S17. When the prescribed diagnosis execution condition is satisfied, diagnosis unit 560 performs diagnosis processing (S20) for battery assembly 300, and when the prescribed diagnosis execution condition is not satisfied, it does not perform diagnosis processing (S20) for battery assembly 300.

In S11, diagnosis unit 560 determines whether or not the first OFF period (for example, the period from t11 to t12 shown in FIG. 6) is longer than a prescribed threshold value Y4. In S12, diagnosis unit 560 determines whether or not the second OFF period (for example, the period from t13 to t14 shown in FIG. 6) is longer than a prescribed threshold value Y5. Each of threshold values Y4 and Y5 is set to such magnitude as depolarizing battery assembly 300 polarized at the time when a current flows. In this embodiment, the duration of the first OFF period and threshold value Y4 correspond to an exemplary "first time period" and an exemplary "fourth threshold value" according to the present disclosure, respectively. The duration of the second OFF period and threshold value Y5 correspond to an exemplary "second time period" and an exemplary "fifth threshold value" according to the present disclosure, respectively.

Figure 8:
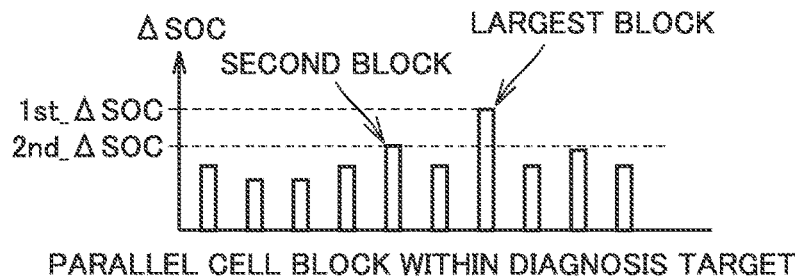
FIG. 8 is a diagram for illustrating a largest block and a second block.

In S13, largest block identification unit 530 identifies the largest block. The identified largest block is stored in storage 503. FIG. 8 is a diagram for illustrating the largest block and the second block. Referring to FIG. 8, the largest block refers to a parallel cell block largest in $\Delta$SOC in the diagnosis target (cell stack 200). The second block refers to a parallel cell block second largest in $\Delta$SOC in the diagnosis target (cell stack 200). $\Delta$SOC of the largest block and $\Delta$SOC of the second block may be denoted as "1st_$\Delta$SOC" and "2nd_$\Delta$SOC" below, respectively.

Referring again to FIG. 7 together with FIG. 5, in S14, diagnosis unit 560 determines whether or not the first SOC of the largest block is smaller than a prescribed threshold value Y1. In S15, diagnosis unit 560 determines whether or not the second SOC of the largest block is larger than a prescribed threshold value Y2. In S16, diagnosis unit 560 obtains $\Delta$SOC (1st_$\Delta$SOC) of the largest block. In S17, diagnosis unit 560 determines whether or not 1st_$\Delta$SOC is larger than a prescribed threshold value Y3.

Threshold values Y1 to Y3 are threshold values for determining whether or not external charging has been carried out within an SOC range suitable for diagnosis. Threshold value Y1 may be selected, for example, from a range from 20% to 65%. Threshold value Y2 may be selected, for example, from a range from 35% to 80%. Threshold value Y3 may be selected, for example, from a range from 15% to 50%. In this embodiment, threshold values Y1, Y2, and Y3 correspond to an exemplary "first threshold value," an exemplary "second threshold value," and an exemplary "third threshold value" according to the present disclosure, respectively.

The diagnosis execution condition described previously is satisfied when determination as YES is made in all of S11, S12, S14, S15, and S17. When the diagnosis execution condition is satisfied, diagnosis processing (S20) which will be described later is performed.

In this embodiment, diagnosis unit 560 determines whether or not polarization has occurred in battery assembly 300 based on results of determination in S11 and S12, and diagnosis unit 560 makes diagnosis (S20) based on the SOC calculated by SOC calculator 510 in the absence of polarization. When diagnosis unit 560 determines that polarization has occurred, it does not make diagnosis (S20). Specifically, when a time period from turn-off of the start-up switch until start of external charging involved with diagnosis is not longer than threshold value Y4 (NO in S11) and when a time period from end of external charging involved with diagnosis until turn-on of the start-up switch is not longer than threshold value Y5 (NO in S12), it is determined that polarization has occurred. As diagnosis is made based on the SOC calculated in the absence of polarization, accuracy in diagnosis can be improved.

In this embodiment, when the first SOC of the largest block is equal to or higher than threshold value Y1 (NO in S14), when the second SOC of the largest block is equal to or lower than threshold value Y2 (NO in S15), and when $\Delta$SOC of the largest block is equal to or smaller than threshold value Y3 (NO in S17), diagnosis unit 560 does not make diagnosis (S20). According to such a configuration, accuracy in diagnosis by diagnosis unit 560 can be improved.

Figure 9:
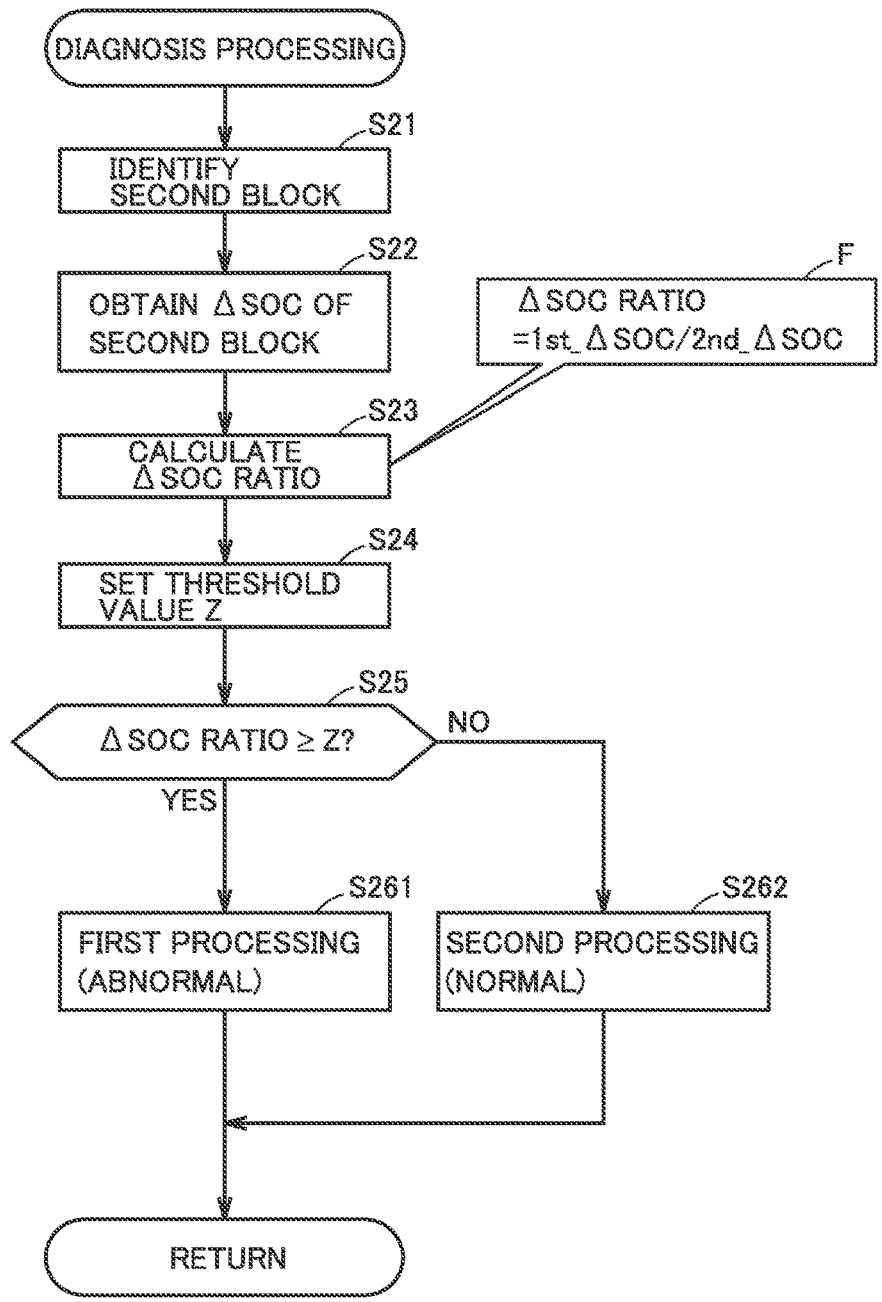
FIG. 9 is a flowchart showing details of diagnosis processing shown in FIG. 7.

FIG. 9 is a flowchart showing details of diagnosis processing (S20) shown in FIG. 7. Referring to FIG. 9 together with FIG. 5, in S21, second block identification unit 540 identifies the second block. In S22, $\Delta$SOC ratio obtaining unit 550 obtains $\Delta$SOC (2nd_$\Delta$SOC) of the second block. In S23, $\Delta$SOC ratio obtaining unit 550 calculates the $\Delta$SOC ratio of the diagnosis target in accordance with an expression F "$\Delta$SOC ratio=1st_$\Delta$SOC/2nd_$\Delta$SOC." In S24, diagnosis unit 560 sets a threshold value Z. Threshold value Z refers to a threshold value for determining whether or not abnormality (that is, break-away of a cell) has occurred in the largest block in the diagnosis target. When abnormality has occurred in the largest block in the diagnosis target, the $\Delta$SOC ratio of the diagnosis target becomes equal to or higher than threshold value Z. Threshold value Z may be a fixed value stored in storage 503 or may be variable.

FIG. 10 is a diagram for illustrating a first example in which threshold value Z is variably set. Referring to FIG. 10, in this example, threshold value Z is variably set in accordance with the first SOC (for example, an average value) and the second SOC (for example, an average value) of the diagnosis target. For example, first threshold value information may be stored in storage 503 (FIG. 1) in advance. The first threshold value information refers to information (see, for example, FIG. 10) that represents relation among the first SOC, the second SOC, and threshold value Z. In S24 in FIG. 9, diagnosis unit 560 may set threshold value Z based on the first threshold value information. Diagnosis unit 560 may increase threshold value Z as the first SOC is higher. Diagnosis unit 560 may decrease threshold value Z as the second SOC is higher.

FIG. 11 is a diagram for illustrating a second example in which threshold value Z is variably set. Referring to FIG. 11, in this example, threshold value Z is variably set in accordance with the duration of the first OFF period and the duration of the second OFF period. For example, second threshold value information may be stored in storage 503 (FIG. 1) in advance. The second threshold value information refers to information (see, for example, FIG. 11) that represents relation among the duration of the first OFF period, the duration of the second OFF period, and threshold value Z. In S24 in FIG. 9, diagnosis unit 560 may set threshold value Z based on the second threshold value information. Diagnosis unit 560 may decrease threshold value Z as the first OFF period is longer. Diagnosis unit 560 may decrease threshold value Z as the second OFF period is longer.

Referring again to FIG. 9 together with FIG. 5, in S25, diagnosis unit 560 determines whether or not the ΔSOC ratio of the diagnosis target calculated in S23 is equal to or higher than threshold value Z set in S24. When the ΔSOC ratio of the diagnosis target is equal to or higher than threshold value Z (YES in S25), diagnosis unit 560 finds that abnormality has occurred (abnormal) in the largest block in the diagnosis target and performs processing (that is, first processing prepared for a case of determination as being abnormal) in S261. In this embodiment, the ΔSOC ratio of the diagnosis target being equal to or higher than threshold value Z means that the ΔSOC deviation degree has exceeded a prescribed level. When the ΔSOC ratio of the diagnosis target is lower than threshold value Z (NO in S25), diagnosis unit 560 finds that no abnormality has occurred (normal) in the largest block in the diagnosis target and performs processing (that is, second processing prepared for a case of determination as being normal) in S262.

In S261, diagnosis unit 560 performs first processing. The first processing may include recording of a result of diagnosis (abnormal). The result of diagnosis may be recorded in storage 503 (FIG. 1). The recorded result of diagnosis may be used in on-board diagnostics (OBD). The first processing may include notification of the result of diagnosis. The notification of the result of diagnosis may be given by notification apparatus 170 (FIG. 1). The first processing may include transmission of the result of diagnosis. The result of diagnosis may be transmitted by communication equipment 180 (FIG. 1). The result of diagnosis may be transmitted to a portable terminal (for example, a tablet terminal, a smartphone, a wearable device, or a service tool) carried by a user.

In S262, diagnosis unit 560 performs second processing. The second processing may include recording of a result of diagnosis (normal). The second processing may include notification of the result of diagnosis. The second processing may include transmission of the result of diagnosis.

Any notification method is applicable in each of the first processing and the second processing. Notification may be given to a user by representation on a display (for example, representation of characters or images), sound (including voice and sound) emitted through a speaker, or turn-on (including blinking) of a prescribed indicator.

As processing in any of S261 and S262 is performed, a series of processing in FIG. 9 ends. The processing in S20 in FIG. 7 thus ends and a series of processing in FIG. 7 also ends.

As described above, when the ΔSOC ratio of the diagnosis target is equal to or higher than threshold value Z (YES in S25), diagnosis unit 560 of ECU 500 determines that abnormality has occurred in the largest block in the diagnosis target. When a cell breaks away in the diagnosis target, ΔSOC of the largest block increases and the ΔSOC ratio of the diagnosis target becomes higher. Therefore, according to the configuration, ECU 500 can properly sense abnormality of parallel cell block 100 that makes up battery assembly 300.

In this embodiment, diagnosis unit 560 determines whether or not the ΔSOC deviation degree has exceeded the prescribed level based on the ΔSOC ratio (that is, the ratio between ΔSOC of the largest block and the ΔSOC reference value). ΔSOC refers to a difference between the first SOC and the second SOC. According to such a diagnosis method, abnormality of the battery assembly can highly accurately be sensed even though the battery assembly to be diagnosed is high in capacity.

FIG. 12 is a diagram showing data resulting from measurement of two types of battery assemblies different from each other in capacity. In each of Example 1 and Example 2 described below, external charging of the battery assembly was carried out to obtain data. Conditions for charging include a charging current of 8 A, a duration of charging of two hours, and an amount of charging of 16 Ah. Example 1 refers to an example where abnormality (break-away of a cell) occurred in a battery assembly having a capacity of 50.0 Ah in a normal condition and the capacity of the battery assembly decreased to 33.3 Ah. Example 2 refers to an example in which abnormality (break-away of a cell) occurred in a battery assembly having a capacity of 150 Ah in a normal condition and the capacity of the battery assembly decreased to 100 Ah.

Referring to FIG. 12, a ΔSOC difference was 16.0% in Example 1 and 5.3% in Example 2. The ΔSOC difference was calculated by subtracting 1st_ΔSOC (the ΔSOC reference value) in the normal condition from 1st_ΔSOC in the abnormal condition. A ΔOCV ratio and an ΔOCV difference also decreased as the capacity of the battery assembly was higher. Thus, with the diagnosis method based on the ΔSOC difference, the ΔOCV ratio, and the ΔOCV difference, accuracy lowers in diagnosis of a battery assembly of a high capacity.

1st_ΔV in FIG. 12 refers to ΔOCV (that is, a difference between a first OCV and a second OCV) of a parallel cell block largest in ΔOCV in the diagnosis target. The ΔOCV ratio refers to a ratio of 1st_ΔV in the abnormal condition to 1st_ΔV in the normal condition. The ΔOCV difference refers to a difference between 1st_ΔV in the abnormal condition and 1st_ΔV in the normal condition.

In contrast, the ΔSOC ratio was 1.5 in each of Example 1 and Example 2. The ΔSOC ratio was calculated by dividing 1st_ΔSOC in the abnormal condition by 1st_ΔSOC (the ΔSOC reference value) in the normal condition. Thus, with the diagnosis method based on the ΔSOC ratio, diagnosis can highly accurately be made for each of the battery assembly of a capacity of 50 Ah and the battery assembly of a capacity of 150 Ah.

In the embodiment, ΔSOC obtaining unit 520 obtains ΔSOC for each parallel cell block included in battery assembly 300 when external charging of battery assembly 300 is carried out. Without being limited as such, ΔSOC obtaining unit 520 may obtain ΔSOC for each parallel cell block included in battery assembly 300 when external power feed with electric power of battery assembly 300 is carried out.

Figure 13:
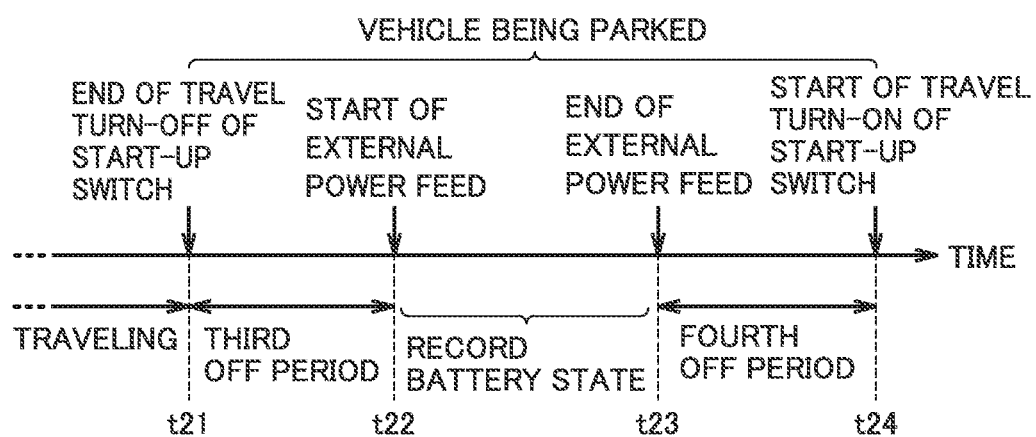
FIG. 13 is a diagram for illustrating a modification of timing at which diagnosis is made.

FIG. 13 is a diagram for illustrating a modification of timing at which diagnosis of battery assembly 300 is made by ECU 500.

Referring to FIG. 13 together with FIGS. 1 and 5, in this modification, a user who has finished driving of vehicle 1 sets the vehicle system to the Ready-OFF state by pressing the start-up switch at timing t21. Timing t21 and timings t22 to t24 which will be described later are recorded in storage 503.

Thereafter, preparation for external power feed is made and external power feed is started at timing t22. A period from timing t21 until timing t22 is also referred to as a "third OFF period" below. A duration of the third OFF period corresponds to a time period from turn-off of the start-up switch until start of external power feed.

SOC calculator 510 calculates the SOC of each parallel cell block 100 based on an output from the battery sensor (more specifically, voltage sensors VB-1 to VB-M, current sensor IB, and temperature sensor TB) immediately before start of external power feed. The SOC obtained at this time corresponds to the first SOC. The first SOC according to this modification refers to the SOC at the time of start of external power feed. The first SOC of each parallel cell block 100 is stored in storage 503.

External power feed started at timing t22 ends at timing t23. During external power feed (that is, a period from timing t22 until timing t23), monitoring module 140 may successively detect a state of battery assembly 300 in real time. Results of detection may be recorded in storage 503. ECU 500 may determine whether or not battery assembly 300 is abnormal based on obtained information. When abnormality is sensed, ECU 500 may give a notification about abnormality and/or record abnormality.

Thereafter, when the user presses the start-up switch at timing t24 while the user presses the brake pedal (not shown), the vehicle system (and ECU 500) is started up and the Ready-ON state is set. A period from timing t23 until timing t24 is also referred to as a "fourth OFF period" below. A duration of the fourth OFF period corresponds to a time period from end of external power feed until turn-on of the start-up switch.

SOC calculator 510 calculates the SOC of each parallel cell block 100 based on an output from the battery sensor (more specifically, voltage sensors VB-1 to VB-M, current sensor IB, and temperature sensor TB) after end of external power feed, for example, at timing t24. The SOC obtained at this time corresponds to the second SOC. The second SOC according to this modification refers to the SOC after end of external power feed. The second SOC of each parallel cell block 100 is stored in storage 503.

Figure 14:
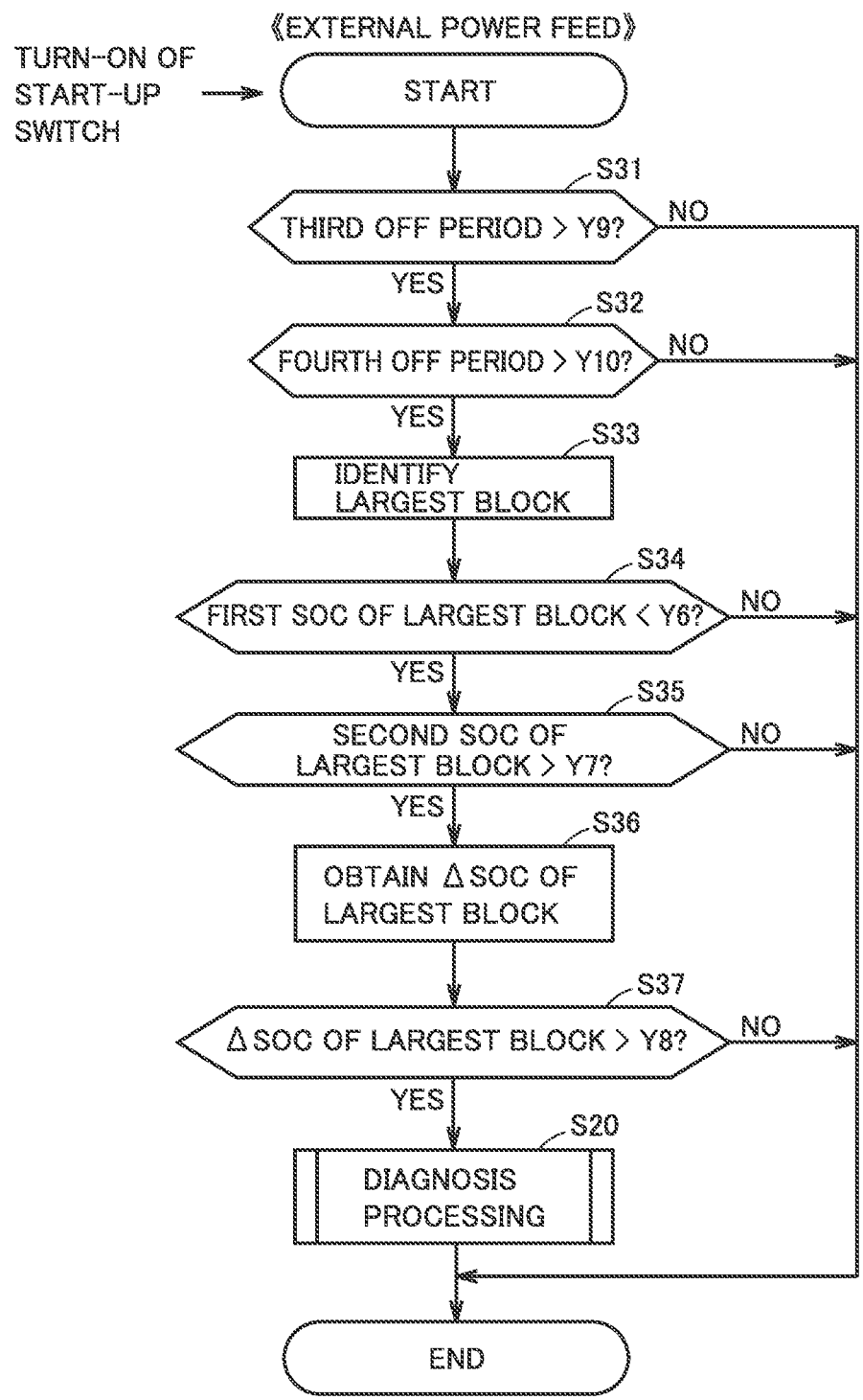
FIG. 14 is a flowchart showing a modification of the battery diagnosis method shown in FIG. 7.

FIG. 14 is a flowchart showing a modification of the battery diagnosis method shown in FIG. 7. Processing shown in this flowchart is started at timing (for example, timing t24 shown in FIG. 13) at which the start-up switch is turned on after end of external power feed from battery assembly 300.

S31 to S37 in FIG. 14 represent steps in accordance with S11 to S17 in FIG. 7. In this modification, however, the third OFF period and the fourth OFF period are adopted instead of the first OFF period and the second OFF period (FIG. 7) and threshold values Y6 to Y10 are adopted instead of threshold values Y1 to Y5 (FIG. 7). In this modification, the duration of the third OFF period and threshold value Y9 correspond to an exemplary "first time period" and an exemplary "fourth threshold value" according to the present disclosure, respectively. The duration of the fourth off period and threshold value Y10 correspond to an exemplary "second time period" and an exemplary "fifth threshold value" according to the present disclosure, respectively. Threshold values Y6, Y7, and Y8 correspond to an exemplary "first threshold value," an exemplary "second threshold value," and an exemplary "third threshold value" according to the present disclosure, respectively. S20 in FIG. 14 is the same as S20 in FIG. 7. The processing shown in FIG. 9 is performed also in S20 in FIG. 14.

For example, while vehicle 1 is parked as shown in FIG. 6 or 13, ECU 500 makes diagnosis of battery assembly 300 by diagnosis unit 560, and while vehicle 1 is traveling, it may make diagnosis of battery assembly 300 with a method different from diagnosis unit 560. While vehicle 1 is traveling, ECU 500 may determine whether or not battery assembly 300 is abnormal based on magnitude (or variation) of electrical resistance of each parallel cell block 100.

Though a ratio (=1st_ΔSOC/2nd_ΔSOC) of 1st_ΔSOC to 2nd_ΔSOC is adopted as the ΔSOC deviation degree in the embodiment, the ΔSOC deviation degree is not limited thereto. For example, a ratio (=2nd_ΔSOC/1st_ΔSOC) of 2nd_ΔSOC to 1st_ΔSOC may be adopted as the ΔSOC deviation degree, and when this ratio is equal to or lower than a prescribed value, determination as being abnormal may be made in diagnosis. The ΔSOC difference (for example, an absolute value of a difference between 1st_ΔSOC and 2nd_ΔSOC) may be adopted as the ΔSOC deviation degree instead of the ΔSOC ratio, and when the ΔSOC difference is equal to or larger than a prescribed value, determination as being abnormal may be made in diagnosis. The SOC ratio can also be adopted as ΔSOC instead of the SOC difference.

In the embodiment, a single cell stack 200 is defined as one diagnosis target. Without being limited as such, any diagnosis target can be set. For example, two or more cell stacks 200 may be defined as one diagnosis target. Battery assembly 300 as a whole may be defined as one diagnosis target.

The battery assembly diagnosed by the battery diagnosis apparatus is not limited to the battery assembly mounted on a vehicle. The battery assembly diagnosed by the battery diagnosis apparatus may be a battery assembly mounted on transportation means (a ship or an airplane) other than the vehicle, a battery assembly mounted on an unmanned mobile body (an automated guided vehicle (AGV), an agricultural implement, a movable robot, or a drone), or a battery assembly used in a building (a house or a factory).

Various modifications may be carried out as being combined in any manner. The battery diagnosis apparatus may perform both of the battery diagnosis method shown in FIG. 7 and the battery diagnosis method shown in FIG. 14.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery diagnosis apparatus that diagnoses a battery assembly including a plurality of parallel cell blocks, the battery diagnosis apparatus comprising:
   an SOC calculator;
   a ΔSOC obtaining unit;
   a largest block identification unit; and
   a diagnosis unit,
   each of the plurality of parallel cell blocks including a plurality of cells connected in parallel,
   the plurality of parallel cell blocks being connected in series to each other, wherein the SOC calculator calculates an SOC for each of the parallel cell blocks included in the battery assembly based on an output from a battery sensor that detects a state of the battery assembly, when charging or discharging of the battery assembly is carried out, the ΔSOC obtaining unit obtains ΔSOC for each of the parallel cell blocks included in the battery assembly, the ΔSOC representing magnitude of deviation between a first SOC and a second SOC, the first SOC representing the SOC at time of start of the charging or the discharging, the second SOC representing the SOC after end of the charging or the discharging, the largest block identification unit identifies a largest block, the largest block being a parallel cell block largest in the ΔSOC in a diagnosis target set as a part or entirety of the battery assembly, and the diagnosis unit make diagnosis of the diagnosis target based on a degree of deviation between the ΔSOC of the largest block and a ΔSOC reference value, and in the diagnosis, when the degree of deviation exceeds a prescribed level, the diagnosis unit determines that abnormality has occurred in the largest block in the diagnosis target.

2. The battery diagnosis apparatus according to claim 1, wherein when at least one of a condition that the first SOC of the largest block is equal to or higher than a first threshold value, a condition that the second SOC of the largest block is equal to or lower than a second threshold value, and a condition that the ΔSOC of the largest block is equal to or smaller than a third threshold value is satisfied, the diagnosis unit does not make the diagnosis.

3. The battery diagnosis apparatus according to claim 1, wherein the diagnosis unit determines whether polarization has occurred in the battery assembly and makes the diagnosis based on the SOC calculated by the SOC calculator in absence of polarization.

4. The battery diagnosis apparatus according to claim 1, wherein the ΔSOC represents a difference between the first SOC and the second SOC, and the diagnosis unit determines whether the degree of deviation has exceeded the prescribed level based on a ratio between the ΔSOC of the largest block and the ΔSOC reference value.

5. The battery diagnosis apparatus according to claim 4, wherein the battery assembly has a capacity equal to or higher than 100 Ali.

6. The battery diagnosis apparatus according to claim 1, further comprising a second block identification unit, wherein the second block identification unit identifies a second block, the second block being a parallel cell block second largest in the ΔSOC in the diagnosis target, and the ΔSOC reference value is the ΔSOC of the second block.

7. The battery diagnosis apparatus according to claim 1, wherein the battery assembly includes at least fifty parallel cell blocks, and the diagnosis target includes at least five parallel cell blocks.

8. A vehicle comprising:

the battery diagnosis apparatus according to claim 1;

the battery assembly; and the battery sensor.

9. The vehicle according to claim 8, wherein the ΔSOC obtaining unit of the battery diagnosis apparatus obtains the ΔSOC for each of the parallel cell blocks included in the battery assembly when external charging of the battery assembly is carried out, the first SOC represents the SOC at time of start of the external charging and the second SOC represents the SOC after end of the external charging, and the external charging is charging of the battery assembly with electric power supplied from outside of the vehicle.

10. The vehicle according to claim 8, wherein the ΔSOC obtaining unit of the battery diagnosis apparatus obtains the ΔSOC for each of the parallel cell blocks included in the battery assembly when external power feed with electric power of the battery assembly is carried out, the first SOC represents the SOC at time of start of the external power feed and the second SOC represents the SOC after end of the external power feed, and the external power feed is discharging of the battery assembly for supplying electric power stored in the battery assembly to outside of the vehicle.

11. The vehicle according to claim 8, wherein when a prescribed diagnosis execution condition is satisfied at timing of turn-on of a start-up switch of the vehicle, the diagnosis unit of the battery diagnosis apparatus makes the diagnosis, and when at least one of a condition that a first time period from turn-off of the start-up switch until start of the charging or the discharging involved with the diagnosis is equal to or shorter than a fourth threshold value and a condition that a second time period from end of the charging or the discharging involved with the diagnosis until turn-on of the start-up switch is equal to or shorter than a fifth threshold value is satisfied, the diagnosis unit of the battery diagnosis apparatus does not make the diagnosis.

12. The vehicle according to claim 8, wherein the battery sensor includes a plurality of voltage sensors provided in respective ones of all parallel cell blocks included in the diagnosis target, output signals from the plurality of voltage sensors are provided to the battery diagnosis apparatus through a common signal processing circuit, and the SOC calculator of the battery diagnosis apparatus calculates the SOC for each of the parallel cell blocks included in the battery assembly based on the output signals from the plurality of voltage sensors that are processed by the common signal processing circuit.

* * * * *